United States Patent
Gajda

(10) Patent No.: US 9,112,513 B2
(45) Date of Patent: Aug. 18, 2015

(54) CALIBRATING TEMPERATURE COEFFICIENTS FOR INTEGRATED CIRCUITS

(71) Applicant: Atmel Corporation, San Jose, CA (US)

(72) Inventor: Bartosz Gajda, Trondheim (NO)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 14/085,681

(22) Filed: Nov. 20, 2013

(65) Prior Publication Data

US 2015/0137896 A1  May 21, 2015

(51) Int. Cl.
*H03L 1/02* (2006.01)
*H03K 3/03* (2006.01)

(52) U.S. Cl.
CPC ............... *H03L 1/02* (2013.01); *H03K 3/0315* (2013.01)

(58) Field of Classification Search
CPC ...... H03K 3/0315; H03K 3/0322; H03L 1/02; H03L 1/022; G05F 3/245
USPC ............................ 331/57, 176; 327/512, 513
See application file for complete search history.

(56) References Cited

U.S. PATENT DOCUMENTS

| | | | |
|---|---|---|---|
| 6,181,191 B1 * | 1/2001 | Paschal | 327/513 |
| 6,356,161 B1 * | 3/2002 | Nolan et al. | 331/176 |
| 7,956,695 B1 * | 6/2011 | Ding et al. | 331/17 |
| 2012/0119819 A1 * | 5/2012 | Pyo et al. | 327/513 |
| 2012/0194278 A1 * | 8/2012 | Bugbee et al. | 331/8 |

* cited by examiner

*Primary Examiner* — Ryan Johnson
(74) *Attorney, Agent, or Firm* — Fish & Richardson P.C.

(57) ABSTRACT

A calibration system and method are disclosed that include a first bias current generator configured for generating a first bias current that is proportional to absolute temperature (PTAT) and a second bias current generator configured for generating a second bias current that is complementary to absolute temperature (CTAT). The first and second bias currents are copied, multiplied and then summed into a total output bias current, which can be used to bias an electronic circuit. A temperature coefficient is calibrated by changing a ratio of the first and second bias current contributions to the total output bias current, while maintaining the same total output bias current level for a given temperature.

15 Claims, 3 Drawing Sheets

402 — GENERATING PTAT AND CTAT BIAS CURRENTS

404 — SUMMING BIAS CURRENTS TO GENERATE TOTAL BIAS CURRENT

406 — BIASING CALIBRATED CIRCUIT WITH TOTAL BIAS CURRENT

408 — CALIBRATING TEMPERATURE COEFFICIENT OF CALIBRATED CIRCUIT BY CHANGING RATIO BETWEEN PTAT AND CTAT BIAS CURRENTS WHILE MAINTAINING TOTAL BIAS CURRENT

CALIBRATING TEMPERATURE COEFFICIENTS FOR INTEGRATED CIRCUITS

TECHNICAL FIELD

This disclosure relates generally to calibrating temperature coefficients for integrated circuits.

BACKGROUND

An oscillator (e.g., a ring oscillator) is often used in electronic circuits to generate precise clock signals. The oscillation frequency varies with ambient temperature, which can affect the operation of the electronic circuit. It is therefore desirable to reduce the influence of the change of ambient temperature on the oscillator frequency.

SUMMARY

A calibration system and method is disclosed that includes a first bias current generator configured for generating a first bias current that is proportional to absolute temperature (PTAT) and a second bias current generator configured for generating a second bias current that is complementary to absolute temperature (CTAT). The first and second bias currents are copied, multiplied and then summed into a total output bias current, which can be used to bias a circuit. A temperature coefficient of the circuit is calibrated by changing a ratio of the first and second bias current contributions to the total output bias current, while maintaining the same total output bias current level for a given temperature.

In some implementations, a method of calibrating a temperature coefficient of a circuit comprises: generating a first bias current that is proportional to absolute temperature; generating a second bias current that is complementary to absolute temperature; summing multiplied copies of the first and second bias currents to provide a total output bias current; changing a ratio between the first and second bias currents while maintaining the total output bias current at a given temperature; and biasing the circuit with the total output bias current.

In some implementations, a system for calibrating a temperature coefficient of a circuit comprises: a first bias current generator configured for generating a first bias current that is proportional to absolute temperature; a second bias current generator configured for generating a second bias current that is complementary to absolute temperature; a summer configured for summing multiplied copies of the first and second bias currents to provide a total output bias current for biasing the circuit; and a temperature coefficient calibration circuit configured to change a ratio between the first and second bias currents while maintaining the total output bias current at a given temperature.

In some implementations, a circuit for calibrating a temperature coefficient of an electronic circuit, comprises: a first bias current generator configured for generating a first bias current that is proportional to absolute temperature; a second bias current generator configured for generating a second bias current that is complementary to absolute temperature; a summer configured for summing multiplied copies of the first and second bias currents to provide a total output bias current for biasing the electronic circuit; and a temperature coefficient calibration circuit configured for changing a ratio of the first and second bias currents based on input values.

Particular implementations of the calibration system and method provides one or more of the following advantages: 1) no need for complex bias current generation circuits; 2) simple control over calibration scheme/procedure; and 3) accuracy limited only by unit currents and resolution of programmable current sources used to provide current from bias current generators to a calibrated circuit and linearity.

DETAILED DESCRIPTION

Example Circuit

Figure 1:
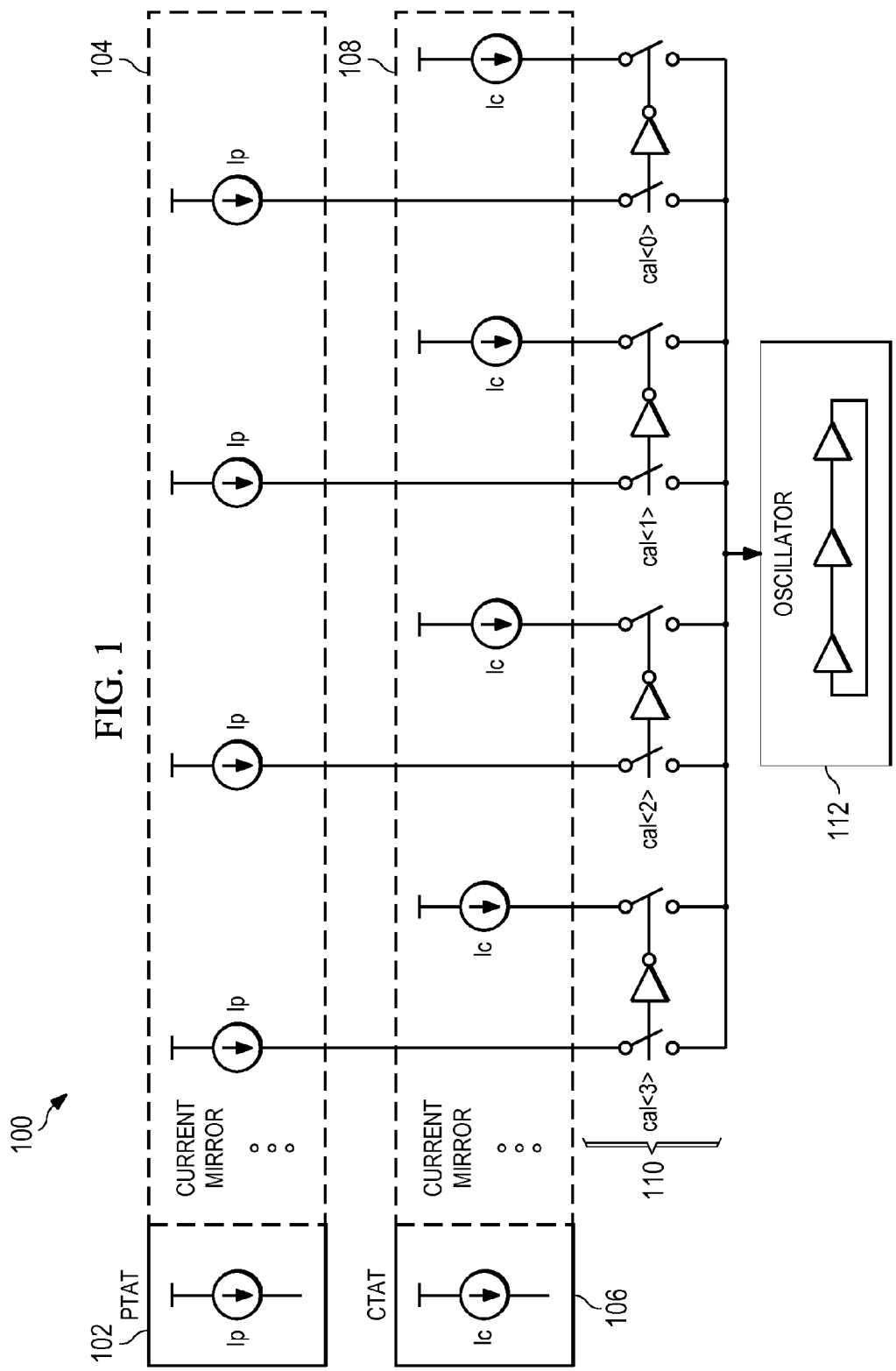
FIG. 1 is a conceptual diagram of an example system for calibrating a temperature coefficient of an electronic circuit.

FIG. 1 is a conceptual diagram of an example system 100 for calibrating a temperature coefficient of an electronic circuit. In the example shown, circuit 112 is a ring oscillator (e.g., a current-starved ring oscillator). Although the example implementations described in this specification include a current-starved ring oscillator, system 100 is applicable to any biased ring oscillator, independent of topology, oscillation frequency or the oscillator's intrinsic temperature coefficient. System 100 is also applicable to any circuit, which can be calibrated in production or runtime or in any application where a circuit can benefit from using current having a specific or defined (not necessarily equal to zero) temperature coefficient.

System 100 includes PTAT bias current generator 102, CTAT bias current generator 106, current source banks 104, 108, switch bank 110 and circuit 112. PTAT bias current generator 102 is coupled to current source bank 104 and CTAT bias current generator 106 is coupled to current source bank 108. In the example shown, each of current source banks 104, 108 includes four current sources, which are labeled Ip, Ic, respectively, to indicate proportional and complementary unit currents.

In this example, current source banks 104, 108 each include four current mirrors. Current source banks 104, 108 can include any desired number of current sources, based on the number of calibration bits (resolution) desired. In the example shown, there are four calibration bits cal<3>, cal<2>, cal<1> and cal<0>, coupled through switch bank 110 to one current mirror in each of current source banks 104, 108 (a current source pair). The values of the calibration bits generally represent the temperature coefficient of the total output bias current that biases circuit 112. In practice, any desired number of calibration bits can be used and any desired encoding (e.g., binary, thermometric). In this example, thermometric encoding is used. The current mirrors provide unit currents which can be summed by a summer (e.g., a wire) to provide a total output bias current for circuit 112. Specifically, current mirrors in current source bank 104 copy a first bias current provided by PTAT bias current generator 102 and the current mirrors in current bank 108 copy a second bias current provided by CTAT bias current generator 106. PTAT and CTAT current units are contributed to the total output bias current in a complementary manner, resulting in a constant total output bias current at a given temperature. For example, while the calibration bits <3:0> are being swept, the total output bias current is constant at a given temperature. In system 100, the total number of unit currents that are switched on at a given time is always the same no matter how much CTAT current or PTAT current contributes to the total output bias current. Any known current mirror topologies can be used in system 100, and preferably topologies with the highest possible output impedance (e.g., a cascoded current mirror).

Switch bank 110 includes switches and inverters for switching in current units from current source banks 104, 108. In the example shown, there are two switches and one inverter for each current source pair. The switches can be implemented using transistors configured as switches. The inverters ensure that for each current source pair only one of PTAT unit current (Ip) or CTAT unit current (Ic) is summed to provide the total output bias current for circuit 112. For example, if the calibration bit set is 1111, then only PTAT unit currents (Ip) contribute to the total output bias current. Similarly, if the calibration bit set is 0000, then only CTAT unit currents (Ic) contributes to the total output bias current. If the calibration bit set is 0011 then the CTAT unit currents contributed by the first and second current source pairs (counting pairs from left to right in FIG. 1) is added to the PTAT unit currents contributed by the third and fourth current source pairs.

Accordingly, a calibration method using system 100 that uses simple PTAT and CTAT current bias generators 102, 106, to provide total bias output current for circuit 112 has been described. Bias current generators 102, 106 do not need calibration, thus simplifying the system design. Circuit 112 is biased with a total output bias current that is a sum of the contributing PTAT and CTAT unit currents. The temperature coefficient for circuit 112 is determined by changing the ratio between PTAT and CTAT bias current contributions to the total output bias current, while keeping the same total output bias current level at a given temperature. In this example, circuit 112 is a current-starved ring oscillator and by maintaining a constant total output bias current level the oscillation frequency is also maintained at a constant level. Changing the ratio is done by complementarily changing the multiplication factors for PTAT and CTAT bias currents using calibration bit sets. For example, the values of the calibration bits determine the number of PTAT bias currents and the number of CTAT bias currents that are contributed (e.g., switched in by switch bank 110) to the total output bias current for circuit 112. The calibration bit set can be programmed into a hardware register or memory by a user during production using a programming device (e.g., a computer). In some implementations, the calibration bits can be hardwired to 0 or 1 values as desired.

An advantage of system 100 is that it provides simple control over a calibration procedure by maintaining the total output bias current for a given temperature while the temperature coefficient is calibrated or changed. In the case of a ring oscillator, first the frequency level is calibrated at room temperature and then the temperature coefficient is calibrated at a hot temperature (e.g., 85° C.). This ensures that the frequency level will stay at the desired level after the temperature coefficient is calibrated, reducing the number of iterations in the calibration procedure that would be necessary without system 100.

Figure 2:
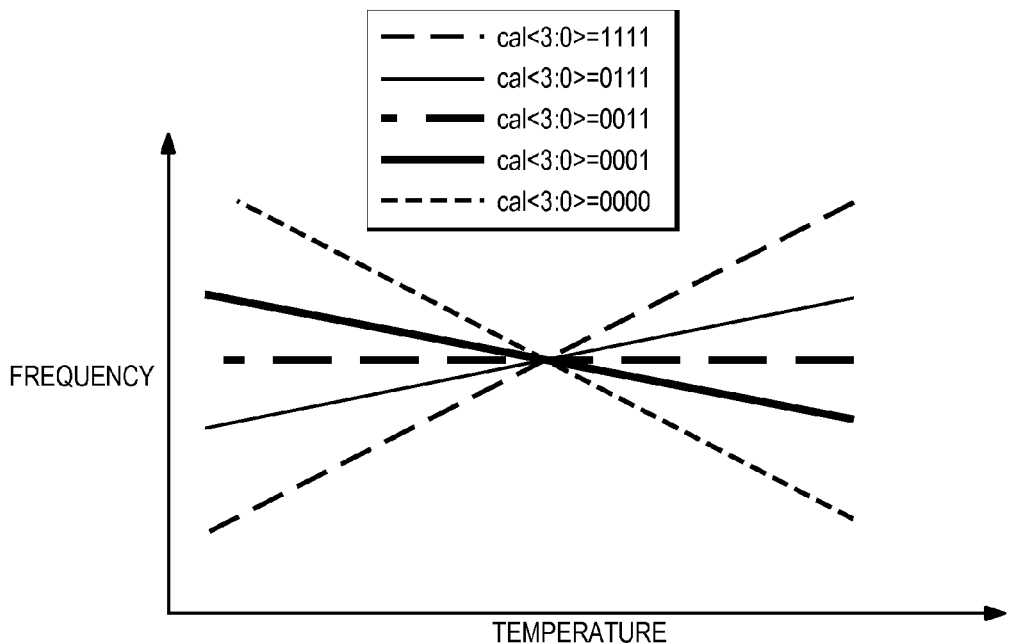
FIG. 2 is plot of frequency versus temperature for various calibration bit sets.

FIG. 2 is plot of frequency versus temperature for various calibration bit sets. In the example shown, there are four calibration bit sets and the circuit 112 is a ring oscillator that has a desired oscillation frequency. Calibration bit set 0011 results in an ideal calibration where the frequency is constant for a given temperature range. In this example, the calibration bit set 0011 represents the temperature coefficient of the ring oscillator. In practice, the calibration bit set can be determined (e.g., in production or at runtime) by observing the frequency at various temperatures. The ideal set of calibration bits will ensure that the total bias output current provided to the ring oscillator is adjusted to maintain the constant frequency for a given temperature range. In practice, the ring oscillator can be calibrated for at least two temperature points, such as a nominal temperature (room temperature) and a specified high temperature, such as the maximum expected temperature for the environment where the ring oscillator will be operating. Note that when using system 100 it is not necessary to know the temperature coefficient (frequency versus temperature) for the ring oscillator because the temperature coefficient can be compensated by calibrating the total output bias current to have the opposite temperature coefficient that is not necessarily equal to zero.

Figure 3:
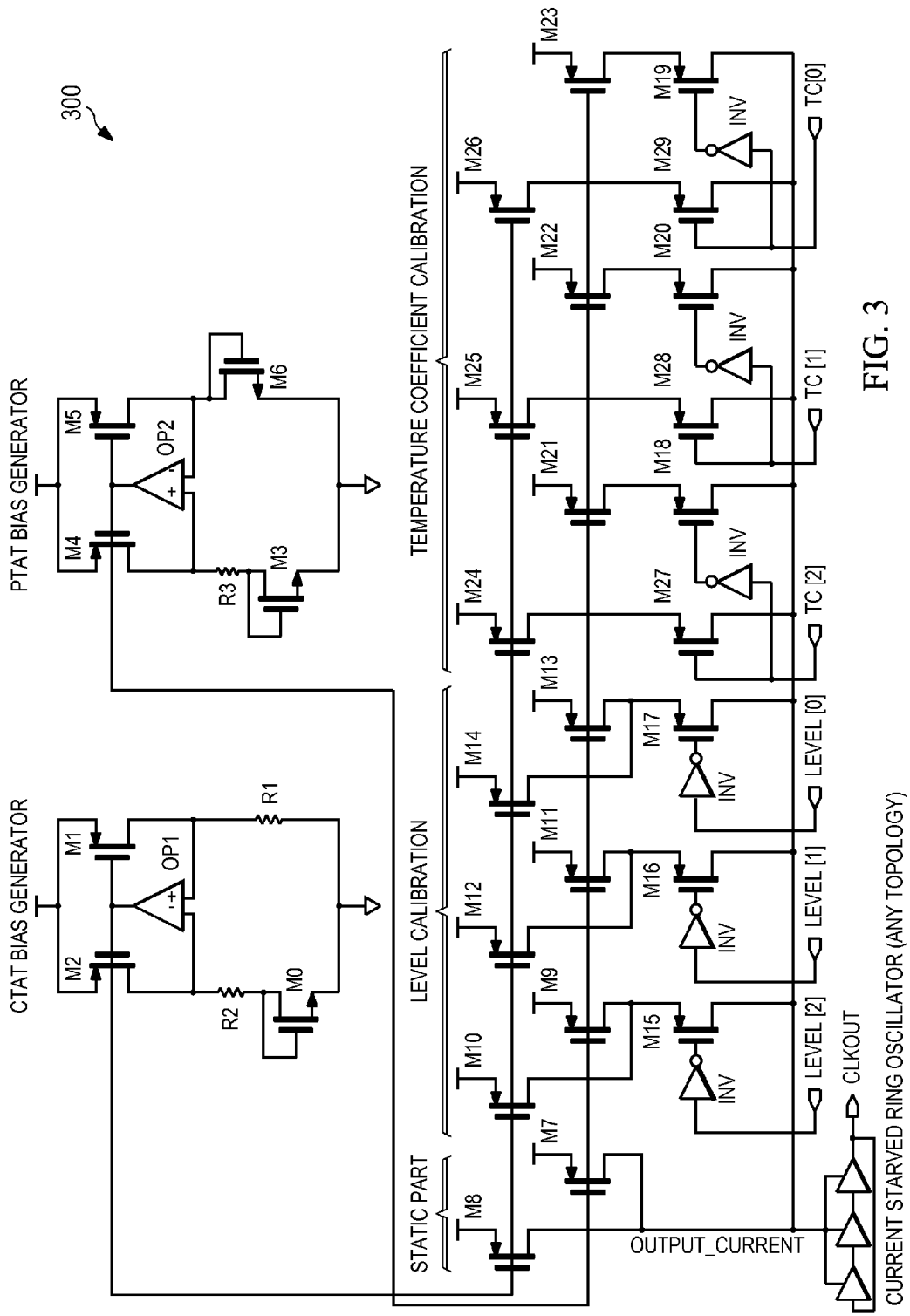
FIG. 3 is a simplified schematic diagram of a circuit for calibrating a temperature coefficient of an electronic circuit.

FIG. 3 is a simplified schematic diagram of circuit 300 for calibrating a temperature coefficient of an electronic circuit. In practice, circuit 300 would include additional circuitry, such as biasing for amplifiers, startup circuits and cascodes for current mirrors.

In this example circuit 300, a current-starved ring oscillator is the electronic circuit that receives the bias current. Circuit 300 can be conceptually broken down into parts including a CTAT bias current generator, a PTAT bias current generator, a static part, a level calibration part and a temperature coefficient calibration part. The static part can be used to introduce some offset current to achieve higher oscillation frequencies (e.g., to have an oscillator for which the frequency level can be calibrated between 90 MHz-110 MHz). The static part can also be used to set some specific temperature coefficient (in a typical condition) during the design phase (e.g., by unbalancing the number of CTAT and PTAT units used for the static part). The level calibration part can be programmed with level calibration bits LEVEL [3:0] to obtain a desired frequency level for the ring oscillator. Changing the level is done by simultaneously increasing or decreasing the number of CTAT & PTAT units. The temperature coefficient calibration part implements the concepts described in reference to FIGS. 1 and 2. Specifically, the temperature coefficient calibration part can be programmed with temperature coefficient bits TC [2:0] to set the temperature coefficient for the ring oscillator. The number of LEVEL and TC bits are only examples and any number of LEVEL or TC bits can be used with appropriate modification to circuit 300 based on the desired resolution for the frequency level and temperature coefficient.

Referring to the temperature coefficient calibration part, transistors M24-M26 are current sources (e.g., current mirrors) that provide CTAT bias currents and transistors M21-M23 are current sources (e.g., current mirrors) that provide PTAT bias currents. Transistors M27 and M18 are configured as switches coupled to an inverter INV to sum bias current units to provide the total output bias current from either M24 or M21 based on the value of TC [2]. Transistors M28 and M20 are configured as switches coupled to an inverter INV to sum bias current units from either M25 or M22 based on the value of TC [1]. Transistors M29 and M19 are configured as switches coupled to an inverter INV to sum bias current units from either M26 or M23 based on the value of TC [0]. The transistors MXX can be any suitable transistor type (e.g., MOSFET).

The CTAT bias generator is an operational amplifier-based current source that includes transistors M0-M2, resistors R1-R2 and operational amplifier OP1. Transistor M0 is configured to operate as a diode. The PTAT bias generator is an operational amplifier-based current source that includes transistors M3-M5, resistor R3 and operational amplifier OP2.

Transistors M3 and M6 are configured to operate as diodes. Note that transistor M3 has a larger width than transistor M6.

The CTAT amplifier OP1 is configured in a feedback loop, forcing identical voltages at both of its inputs by adjusting the current sourced by M1 & M2 (the ratio between M1 and M2 can be different than one). The current value, for which the voltages across the serial connection of M0 & R2 and across R1 are identical, decreases proportionally to absolute temperature. That's because the resistance of R1 (and R2) is relatively constant versus temperature while the threshold voltage of the diode-connected M0 is inversely proportional to the absolute temperature.

The PTAT amplifier OP2 is configured in a feedback loop, forcing identical voltages at both its inputs by adjusting the current sourced by M4 and & M5 (the ratio between M4 and M5 can be different than one). The width of M3 is N times bigger than the width of M6 which makes M3 operate in a weaker inversion than M6 operates (Veff=Vgs−Vth is much lower for M3 than for M6). This causes M3 and M6 to have different behavior versus absolute temperature and that there is a current value different than zero for which voltages across the serial connection of R3 and M3 and across M6 are identical. That current value is proportional to the absolute temperature because the threshold voltages of both M3 and M6 are inversely proportional to the absolute temperature. The topologies of the CTAT and PTAT bias generators shown in FIG. 3 are example topologies and other topologies can also be used in circuit 300.

The total output bias current $I_{total}$ can be represented mathematically as $$I_{total} = I_{total\_nom} \cdot [1 + TC_{total} \cdot (T - T_{nom})], \quad [1]$$

$$TC_{total} = \frac{I_{PTAT\_nom} \cdot TC_{PTAT} + I_{CTAT\_nom} \cdot TC_{CTAT}}{I_{PTAT\_nom} + I_{CTAT\_nom}}, \quad [2]$$

$$I_{total\_nom} = I_{PTAT\_nom} + I_{CTAT\_nom} = \text{constant}, \quad [3]$$

where T is absolute temperature, $T_{nom}$ is absolute nominal temperature, $I_{total}$ is total output bias current, $I_{total\_nom}$ is total nominal output bias current (at $T_{nom}$), $I_{PTAT\_nom}$ is total nominal PTAT current (at $T_{nom}$), $I_{CTAT\_nom}$ is total nominal CTAT current (at $T_{nom}$), $TC_{total}$ is the temperature coefficient of the output bias current ($I_{total}$), $TC_{PTAT}$ is the temperature coefficient of the PTAT current and $TC_{CTAT}$ is the temperature coefficient of the CTAT current. Note that Equation[3] is valid for a given level.

Figure 4:
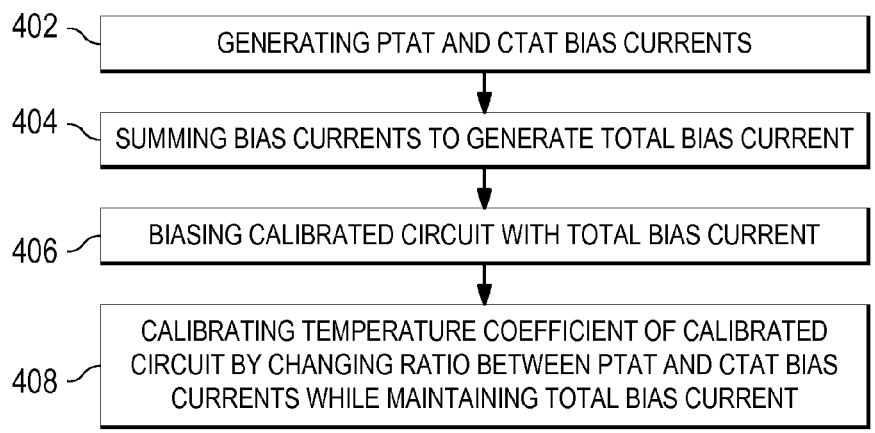
FIG. 4 is a flow diagram of a process of calibrating a temperature coefficient of an electronic circuit.

FIG. 4 is a flow diagram of a process 400 for calibrating a temperature coefficient of an electronic circuit. Process 400 can be implemented by, for example, circuit 300.

In some implementations, process 400 can begin by generating PTAT and CTAT bias currents (402), as described in reference to FIG. 3. Process 400 can continue by summing bias currents to generate a total output bias current (404), as described in reference to FIG. 3. The summing can be performed by a summer circuit, which in this example is a wire.

Process 400 can continue by biasing a circuit with the total output bias current (406), as described in reference to a ring oscillator shown in FIG. 3. Process 400 can continue by calibrating the temperature coefficient by changing the ratio between PTAT and CTAT bias current units that are contributed to the total output bias current, while maintaining the total output bias current level constant for a given temperature (408). The ratio can be changed using a desired number of calibration bits that actuate switches in a switch bank so that multiplied copies of PTAT and CTAT bias current units sum together to provide a temperature compensated total output bias current.

Process 400 described above can be used for circuits that have close to constant temperature coefficient versus temperature (circuits that have as much as possible linearity versus temperature). Process 400 can also be used to tune/calibrate circuits that are nonlinear versus temperature but the nonlinearity may need to be compensated by, for example, introducing some nonlinearity in the bias generator circuits (PTAT, CTAT) to compensate for the nonlinear behavior of the biased circuit (curvature correction) or to obtain a specific nonlinear behavior at the output parameter (e.g., frequency).

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A method of calibrating a temperature coefficient of a circuit comprising:
    generating a first bias current that is proportional to absolute temperature;
    generating a second bias current that is complementary to absolute temperature;
    summing multiplied copies of the first and second bias currents to provide a total output bias current;
    changing a ratio between the first and second bias current contributions to the total output bias current by including or excluding the current contributions of one or more of the multiplied copies of the first and second bias currents to the total output bias current while maintaining the total output bias current for a given temperature;
    adjusting a frequency level of the circuit by simultaneously increasing or decreasing the first and second bias current contributions according to programmable bits; and
    biasing the circuit with the total output bias current.

2. The method of claim 1, where changing the ratio includes changing multiplication factors of current mirrors generating copies of the first and second bias currents.

3. The method of claim 1, where the circuit is a ring oscillator.

4. A system for calibrating a temperature coefficient of a circuit, comprising:
    a first bias current generator configured for generating a first bias current that is proportional to absolute temperature;
    a second bias current generator configured for generating a second bias current that is complementary to absolute temperature;
    a summer coupled to the circuit, the summer configured for summing multiplied copies of the first and second bias currents to provide a total output bias current for biasing the circuit;
    a temperature coefficient calibration circuit coupled to the summer, the temperature coefficient calibration circuit configured to change a ratio between the first and second bias current contributions to the total output bias current by including or excluding the current contributions of one or more of the multiplied copies of the first and second bias currents to the total output bias current while maintaining the total output bias current for a given temperature; and a frequency level calibration circuit coupled to the summer and the temperature coefficient calibration circuit, the frequency level calibration circuit configured to adjust a frequency level of the circuit by simultaneously increasing or decreasing the first and second bias current contributions according to programmable bits.

5. The system of claim 4, further comprising:
a static circuit coupled to the summer and configured to introduce offset current into the circuit.

6. The system of claim 5, where the circuit is a ring oscillator.

7. The system of claim 4, wherein the multiplied copies are provided by
a number of current mirrors coupled to the first and second bias current generators.

8. The system of claim 4, where the first bias current generator and the second bias current generator each include an operational amplifier coupled to transistors to form a feedback loop that generates current that increases or decreases proportionally with absolute temperature.

9. A circuit for calibrating a temperature coefficient of an electronic circuit, comprising:
a programmable register configured to store input values for calibrating the temperature coefficient of the electronic circuit;
a first bias current generator configured for generating a first bias current that is proportional to absolute temperature;
a second bias current generator configured for generating a second bias current that is complementary to absolute temperature;
a summer configured for summing multiplied copies of the first and second bias currents to provide a total output bias current for biasing the electronic circuit;
a temperature coefficient calibration circuit coupled to the summer, the temperature coefficient calibration circuit configured by the input values to change a ratio between the first and second bias current contributions to the total output bias current by including or excluding the current contributions of one or more of the multiplied copies of the first and second bias currents to the total output bias current while maintaining the total output bias current for a given temperature; and a frequency level calibration circuit coupled to the summer and the temperature coefficient calibration circuit, the frequency level calibration circuit configured to adjust a frequency level of the electronic circuit by simultaneously increasing or decreasing the first and second bias current contributions according to programmable bits.

10. The circuit of claim 9, further comprising:
a static circuit coupled to the summer and configured to introduce offset current into the electronic circuit.

11. The circuit of claim 10, where the electronic circuit is a ring oscillator.

12. The circuit of claim 9, wherein the temperature coefficient calibration circuit includes a first set of current mirrors coupled to the first bias current generator and a second set of current mirrors coupled the second bias current generator, and where the first and second sets of current mirrors are configurable to contribute first and second bias currents to a total output bias current.

13. The circuit of claim 12, where the current mirrors are configured to change the ratio of contributions of the first and second bias currents to the total output bias current based on the input values.

14. The circuit of claim 9, where the input values include a set of programmable bits.

15. The circuit of claim 9, where the first bias current generator and the second bias current generator each include an operational amplifier coupled to transistors to form a feedback loop that generates current that increases or decreases proportionally with absolute temperature.

* * * * *